United States Patent [19]
Koscielniak et al.

[11] Patent Number: 6,020,246
[45] Date of Patent: Feb. 1, 2000

[54] FORMING A SELF-ALIGNED EPITAXIAL BASE BIPOLAR TRANSISTOR

[75] Inventors: Waclaw C. Koscielniak, Santa Clara; Kulwant S. Egan; Jayasimha S. Prasad, both of San Jose, all of Calif.

[73] Assignee: National Semiconductor Corporation, Santa Clara, Calif.

[21] Appl. No.: 09/042,430

[22] Filed: Mar. 13, 1998

[51] Int. Cl.⁷ .................................................. H01L 21/331
[52] U.S. Cl. .......................... 438/341; 438/349; 438/350; 438/366; 438/363
[58] Field of Search .................................... 438/341, 349, 438/350, 363, 366

[56] References Cited

U.S. PATENT DOCUMENTS

| | | |
|---|---|---|
| 4,839,305 | 6/1989 | Brighton . |
| 4,968,635 | 11/1990 | Hamasaki . |
| 5,059,544 | 10/1991 | Burghartz et al. . |
| 5,061,644 | 10/1991 | Yue et al. . |
| 5,064,773 | 11/1991 | Feist . |
| 5,137,840 | 8/1992 | Desilets et al. . |
| 5,194,926 | 3/1993 | Hayden ..................................... 257/565 |
| 5,235,206 | 8/1993 | Desilets et al. . |
| 5,389,561 | 2/1995 | Gomi . |
| 5,395,769 | 3/1995 | Arienzo et al. . |
| 5,569,611 | 10/1996 | Imai . |

OTHER PUBLICATIONS

Harame, D.L., et al., Si/SiGe Epitaxial–Base Transistors–Part II: Process Integration and Analog Applications, IEEE Transactions on Electron Devices, vol. 42, No. 3, Mar. 1995, pp. 469–482.

*Primary Examiner*—Wael Fahmy
*Assistant Examiner*—Long Pham
*Attorney, Agent, or Firm*—Beyer & Weaver, LLP

[57] ABSTRACT

An improved method and an apparatus for forming a self-aligned epitaxial base bipolar transistor in a semiconductor material is disclosed. The method of the invention involves forming an intrinsic base region formed by growing an epitaxial semiconductor material over a collector region. A raised sacrificial emitter core is then formed on the intrinsic base region followed by depositing a substantially conformal spacer layer over the sacrificial emitter core. Next, the spacer material is anisotropically etched such that a protective spacer ring is formed about the sacrificial emitter core. An extrinsic base is then formed by implanting dopant into the epitaxial base region wherein the sacrificial emitter core and the spacer ring preserve an emitter region. The spacer ring also serves to self-align the extrinsic base region to the emitter region. The protective sacrificial emitter core and spacer ring are then removed. The self-aligned epitaxial base bipolar transistor is then formed by doping the emitter region.

18 Claims, 8 Drawing Sheets

FORMING A SELF-ALIGNED EPITAXIAL BASE BIPOLAR TRANSISTOR

BACKGROUND OF THE INVENTION

1. Field of the Invention

The present invention relates to the manufacture of semiconductor devices and, more particularly, to forming a bipolar transistor in a semiconductor material.

2. Description of the Related Art

Presently, the trend in semiconductor technology is toward very large scale integration of devices with high speed and low power dissipation. One such device is the bipolar transistor. In order to achieve high speed in combination with low power, it is essential that the bipolar transistor be made as small as possible. The bipolar transistor may be reduced in size by making the vertical junction structure shallower and reducing horizontal geometry within a given lithographic constraint. However, many of the conventional lithographic processes used to define critical structures in the bipolar transistor become significantly more critical as the horizontal geometries are reduced. Such factors as misalignment and surface non-planarity have substantial adverse impact on the ability of many of the conventional photolithographic techniques to adequately resolve surface structures critically important for the successful fabrication of the high speed, low power bipolar transistors.

For high speed bipolar transistors, the two dimensions of critical importance are the emitter stripe width and the base thickness. The emitter stripe width is defined by the lateral dimension of the emitter region, while the base thickness is defined by the vertical dimension of the base region. The base resistance is directly related to the base thickness and is a major factor in the speed of the transistor. In order to produce bipolar transistors that are both high speed and low power, both the emitter stripe width and the base thickness must be made as small as possible. In this manner the transistor speed is commensurably increased.

In the manufacturing of the bipolar transistor, an emitter window (which defines the emitter stripe width) is located and sized by the use of conventional methods of photolithography masking techniques. Unfortunately, the use of these conventional methods of photolithography masking techniques results in inaccuracies due to, for example, improper alignment of the emitter window with the intrinsic base region. This misalignment results in poor reproducibility and low fabrication yields due to, for example, low emitter to base breakdown voltages.

Various conventional techniques have been used to reduce the problems inherently associated with use of conventional photolithography to form bipolar transistors. One such technique allows the formation of an epitaxial base bipolar transistor using self-aligned polysilicon base contacts. This technique is very desirable since it allows self registration of the emitter implant to the extrinsic base and allows the base contact to be moved from the device base area onto the polysilicon. This self registration reduces the device base area as well as allows control of the distance between the emitter and extrinsic base region. Control of the distance between the emitter and the extrinsic base region of the epitaxial base bipolar transistor is critical. If the distance between the emitter and the extrinsic base, for example, is too narrow then unacceptably low emitter-base breakdown voltages will result.

Many conventional methods of fabricating a self-aligned bipolar transistor depend upon photolithographic methods which require the work surface to be substantially planar. These same conventional methods must then rely on costly and complicated photolithographic and fabrication techniques for producing isolation structures that leave the working surface of the wafer substantially planar. By way of example, U.S. Pat. No. 5,340,753, and U.S. Pat. No. 5,235,206 each use a complicated process to form a plurality of isolation trenches capable of both adequately isolating the transistor and preserving the planarity of the wafer surface for critical photolithographic operations.

While the emitter and base as described above are self-aligned, the process steps are numerous and complicated. In addition, the emitter is defined by conventional photolithographic techniques and therefore, the width of the emitter is limited in size. Additionally, the number and complexity of the above described process renders the manufacture of the bipolar transistor expensive and difficult to control which makes the transistor integrated circuit prone to yield loss. In addition, the process described requires the surface of the device to be planar before the epitaxial base and self-aligned emitter are processed. This additional requirement unnecessarily adds to the fabrication process and precludes the use of highly desirable isolation processes such as LOCOS (Local Oxidation of Silicon).

It is therefore desirable to have a process and an apparatus for efficiently fabricating a high speed, low power epitaxial base bipolar transistor that does not rely on critical lithographic steps. The process should be capable of precisely controlling the emitter to extrinsic base distance in a production environment thereby ensuring consistently high fabrication yields.

SUMMARY OF THE INVENTION

To achieve the foregoing and other objects and in accordance with the purpose of the present invention, a method and an apparatus for forming a self-aligned epitaxial base bipolar transistor in a semiconductor material is disclosed. A method of the invention involves forming an intrinsic base region formed from an epitaxial semiconductor material over a collector region. A raised sacrificial emitter core is then formed on the intrinsic base region followed by depositing a substantially conformal spacer layer over the sacrificial emitter core. Next, the spacer material is anisotropically etched such that a protective spacer ring is formed about the sacrificial emitter core. An extrinsic base is then formed by implanting dopant into the epitaxial base region such that the sacrificial emitter core and the spacer ring preserve an emitter region. The spacer ring also serves to self-align the extrinsic base region to the emitter region. The protective sacrificial emitter core and spacer ring are then removed. A self-aligned epitaxial base bipolar transistor is then formed by doping the emitter region.

In another aspect of the invention, a device for forming a self-aligned epitaxial base bipolar transistor in a semiconductor material including a substrate structure having a collector region, a base region, and a plurality of isolation structures is disclosed. The device includes a raised sacrificial emitter core located on the intrinsic base region. A protective spacer ring around the sacrificial emitter core formed by anisotropically etching a substantially conformal spacer layer deposited over the sacrificial emitter core. The sacrificial emitter core and spacer ring preserve an emitter region by blocking a portion of the dopant implanted into the epitaxial base region to form an extrinsic base region. The spacer ring serves to self-align the extrinsic base region relative to the emitter region.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention is illustrated by way of example, and not by way of limitation, in the figures of the accompanying drawings. In the following figures, like reference numerals refer to analogous or similar elements to facilitate ease of understanding.

FIGS. 5–7 are cross sectional views disclosing the fabrication of a sacrificial emitter core at successive stages in accordance with an embodiment of the invention.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

The invention relates, in one embodiment, to an improved method of forming a bipolar transistor. According to one aspect of the present invention, a self-aligned epitaxial base bipolar transistor may be formed by first forming a raised sacrificial emitter core on an intrinsic base region. A substantially conformal spacer layer is then deposited over the sacrificial emitter core. The spacer layer is then anisotropically etched such that a protective spacer ring is formed about the sacrificial emitter core. The spacer ring and sacrificial emitter core provide a protective barrier from dopant implanted into the intrinsic base region to form an extrinsic base region. The sacrificial emitter core and spacer ring block a portion of the dopant to preserve an emitter region. The spacer ring serves to self-align the extrinsic base region relative to the emitter region.

In another aspect of the invention, a device for forming self-aligned epitaxial base bipolar transistor is disclosed. The device includes a raised sacrificial emitter core located on the intrinsic base region and a protective spacer ring around the sacrificial emitter core formed by anisotropically etching a substantially conformal spacer layer deposited over the sacrificial emitter core. The sacrificial emitter core and spacer ring preserve an emitter region by blocking a portion of the dopant implanted into the intrinsic base region to form an extrinsic base region. The spacer ring serves to self-align the extrinsic base region relative to the emitter region.

Embodiments of the invention are discussed below with reference to FIG. 1 through FIG. 16. However, those skilled in the art will readily appreciate that the detailed description given herein with respect to these figures is for explanatory purposes as the invention extends beyond these limited embodiments.

It should be noted that "N" and "P" are used herein to denote semiconductor dopant types, while "+" and "−" are used where appropriate to indicate relative doping concentrations. It should be further understood that, while the invention is illustrated with respect to silicon regions of particular conductivity types, different semiconductor materials and other conductivity types may be substituted. It should also be noted that while the invention is illustrated with respect to an N-P-N bipolar transistor, a P-N-P bipolar transistor may be substituted.

Figure 1:
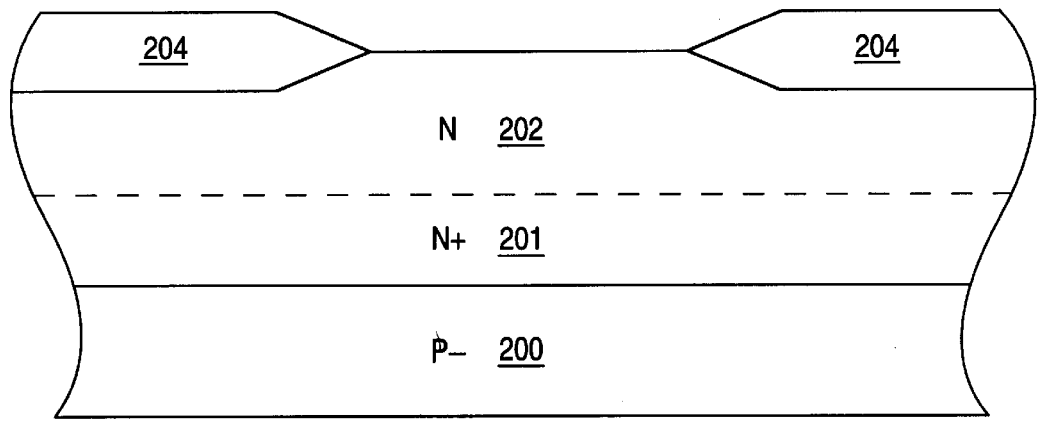
FIG. 1 is a cross sectional view of a stacked semiconductor structure including a substrate overlaid by a collector region and a plurality of isolation structures in accordance with an embodiment of the invention.

Referring first to FIG. 1, a stacked semiconductor structure 120 included in a semiconductor wafer (not shown for clarity) used in a fabrication the self-aligned epitaxial base bipolar transistor is shown. Stacked semiconductor structure 120 includes a P-type substrate 200 of single crystalline silicon. In the described embodiment, the P-type substrate 200 may have a crystal orientation, for example <100>, suitable for the production of semiconductor devices. A sub-collector 201 of $N^+$ silicon may be formed over the P-type substrate 200 by introducing N-type dopant into the P-type substrate 200. The dopant may be any suitable N-type dopant ( e.g. Arsenic) and may be introduced into the P-type substrate 200 by any suitable technique, as for example, diffusion or ion implantation. By way of example, sub-collector 201 and collector layer 202 may be fabricated, for example, by first doping the upper surface of substrate 200 heavily N+.

Electrically isolating the bipolar transistor being formed from other devices in the semiconductor wafer may require a plurality of isolation structures 204 formed of an insulating material. Such insulating material may include, for example, silicon dioxide. In a preferred embodiment, the plurality of isolation structures 204 may have a thickness ranging from about 4000 Å to about 5000 Å with a preferred thickness of approximately 4500 Å. The plurality of isolation structures 204 may be formed by well known techniques, such as LOCOS (Local Oxidation of Silicon) which is well characterized and known for its ease of use and predictability in a production environment. However, when used to form isolation structures such as shown in FIG. 1, LOCOS may produce substantially non-planar working surfaces since silicon dioxide may extend above the surface of the wafer.

Figure 2:
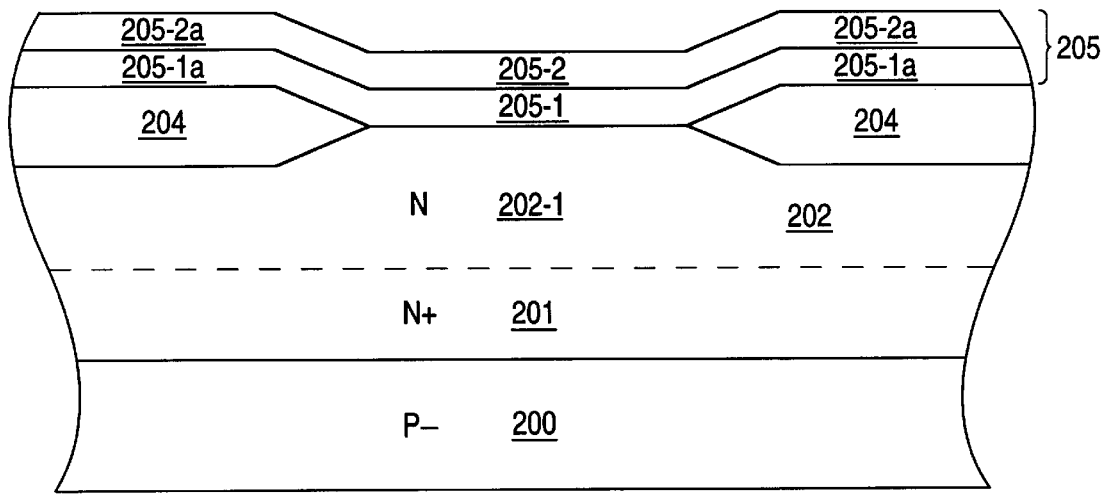
FIG. 2 is a cross sectional view of the stacked semiconductor structure as shown in FIG. 1 illustrating a dual layer intrinsic base.

Referring now to FIG. 2, an intrinsic epitaxial base layer 205 may be epitaxially grown over an active collector 202-1 of the collector region 202 and the plurality of isolation structures 204 using any suitable technique. By way of example, a blanket deposition technique works well. The blanket deposition technique is a production efficient method for depositing material, such as for example epitaxial layers, on the surface of the semiconductor wafer. As such, the blanket deposition process is well suited for use in a high volume production environment.

It should be noted, silicon epitaxially grown over a region of single crystal silicon, will also be single crystalline silicon. It is well known that transistor action having desirable characteristics takes place in silicon having a single crystalline structure. It is therefore desirable that the bipolar transistor being fabricated have an active region formed from silicon having a single crystalline structure such as found in the active collector 202-1 of collector region 202.

In a preferred embodiment, the intrinsic epitaxial base layer 205 includes a first N-type layer 205-1 deposited on the active collector region 202-1. The first N-type layer 205-1 may be formed of single crystalline silicon epitaxially grown over the active collector 202-1. In a preferred embodiment, any suitable N-type dopant (e.g. Arsenic) may be used to form the N-type layer 205-1 having an impurity dopant concentration of about $1 \times 10^{17}/cm^3$. The N-type layer 205-1 may have a thickness ranging from about 400 Å to about 800 Å with a preferred thickness of about 500 Å. As described hereinabove, certain portions 205-1a of the intrinsic epitaxial base layer 205-1 epitaxial grown over the isolation structures 204 will become polycrystalline silicon suitable for extrinsic base regions of bipolar transistors.

In a preferred embodiment, the intrinsic epitaxial base layer 205 may also include a second P-type layer 205-2 formed of single crystalline silicon deposited and epitaxially grown over the first N-type layer 205-1. In the described embodiment, any suitable P-type impurity dopant, such as for example boron (B), may be used in the formation of the P-type layer 205-2. In a preferred embodiment, the P-type layer 205-2 may have an impurity dopant concentration ranging from approximately $2 \times 10^{18}/cm^3$ at an upper surface of layer 205-2 to a concentration of approximately $1 \times 10^{17}/cm^3$ at a lower surface of P-type layer 205-2. Preferably, the P-type layer 205-2 may have a thickness ranging from about 700 Å to about 1400 Å with a preferred thickness of about 900 Å. For reasons discussed hereinabove, a portion 205-2a of the second P-type 205-2 layer deposited and epitaxially grown over the polycrystalline silicon portion 205-1a of the first N-type layer 205-1 will also be polycrystalline silicon.

Since the intrinsic epitaxial base layer 205 was blanket deposited over the surface of the semiconductor wafer, it may be desirable to mask and etch certain portions of the intrinsic epitaxial base layer 205 in selected areas of the semiconductor wafer. Such selected areas may include portions of the epitaxial layer 205, such as for example the portion 205-1a and 205-2a blanket deposited and grown over certain of the plurality of isolation structures 204.

Figure 3:
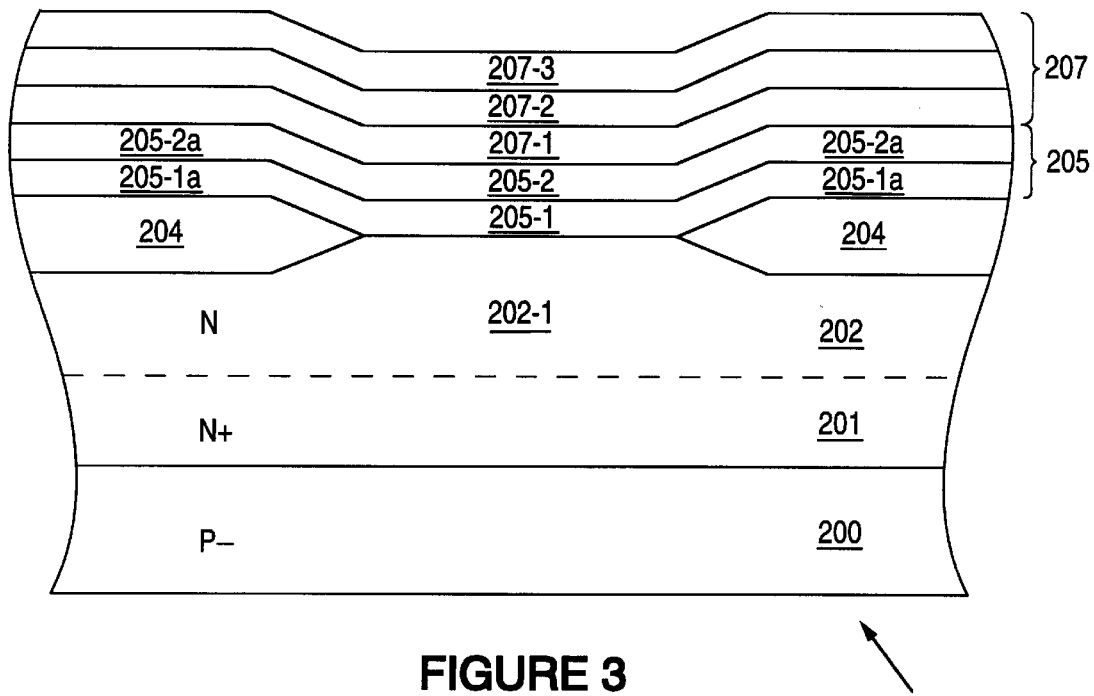
FIG. 3 is a cross sectional view of the stacked semiconductor structure as shown in FIG. 2 showing a first oxide layer, a separation layer, and a second oxide layer successively deposited on the intrinsic base region.

Turning now to FIG. 3 showing a cross sectional view of the stacked semiconductor structure 120 as shown in FIG. 2 after successive deposition of a first oxide layer 207-1, a separation layer 207-2, and a second oxide layer 207-3 in accordance with an embodiment of the invention. The first oxide layer 207-1 may be formed of silicon dioxide deposited on the P-type layer 205-2 by any conventional methods known to those in the art. Such methods may include processes such as chemical vapor deposition (CVD) or low-pressure chemical vapor deposition (LPCVD). In the preferred embodiment, the first oxide layer 207-1 may have a thickness in the range of about 400 Å to about 600 Å with a preferred thickness of 500 Å.

In the preferred embodiment, the separation layer 207-2 may be formed of silicon nitride deposited on the first oxide layer 207-1 by way of a low-pressure chemical vapor deposition process (LPCVD). The separation layer 207-2 may have a thickness ranging from approximately 400 Å to approximately 600 Å with a preferred thickness of 500 Å. In another embodiment, separation layer 207-2 may be formed of silicon oxynitride, or any such material capable of being selectively etched in a manner substantially different from the oxide material forming the second oxide layer 207-3.

Thereafter, the second oxide layer 207-3 is deposited on the separation layer 207-2 by any conventional method such as CVD or LPCVD known by those in the art. In a preferred embodiment, the second oxide layer 207-3 may be formed of silicon dioxide, such as for example TEOS, having a thickness ranging from approximately 2500 Å to approximately 6000 Å with a preferred thickness of approximately 4000 Å. It should be noted that the separation layer 207-2 may act as a form of "etch-stop" whereby any process capable of removing selected portions of the second oxide layer 207-3 must be incapable of removing or substantially affecting the separation layer 207-2. In this manner, it would be possible to remove selected portions of the second oxide layer 207-3 without substantially affecting the first oxide layer 207-1.

Figure 4:
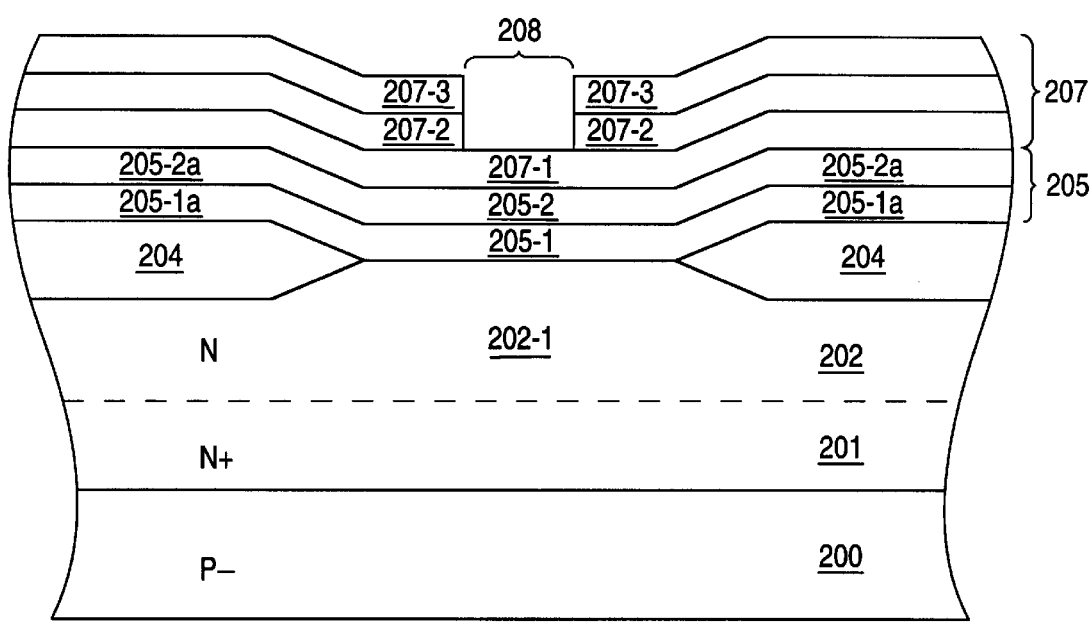
FIG. 4 illustrates a cross sectional view of the stacked semiconductor structure shown in FIG. 3 showing a sacrificial emitter window.

Thereafter, the wafer may be patterned and etched to form a sacrificial emitter core window 208 as shown in FIG. 4. The sacrificial emitter core window 208 may be formed, for example, by using an anisotropic reactive ion etch (referred to in the art as RIE) using for example, $SF_6$, $CF_4$, HBr, $Cl_2$ as reactive gases. The reactive ion etch removes selected portions of the second oxide layer 207-3 such that the separation layer 207-2 may be substantially exposed. As described above, in a preferred embodiment, the separation layer 207-2 may be formed of silicon nitride which is substantially unaffected by a reactive ion etch using $SF_6$, $CF_4$, HBr, $Cl_2$ as reactive gases. A follow on reactive ion etch, using for example $SF_6$, $CF_4$, HBr, $Cl_2$ as the reactive gas, may be used to remove selected portions of the separation layer 207-2 exposing certain portions of the first oxide layer 207-1. As described hereinbelow, the first oxide layer 207-1 serves in subsequent process steps to help define an emitter region of the epitaxial base bipolar transistor. Therefore, it is critical the first oxide layer 207-1 remain substantially unaffected by the second reactive ion etch.

Figures 5, 6:
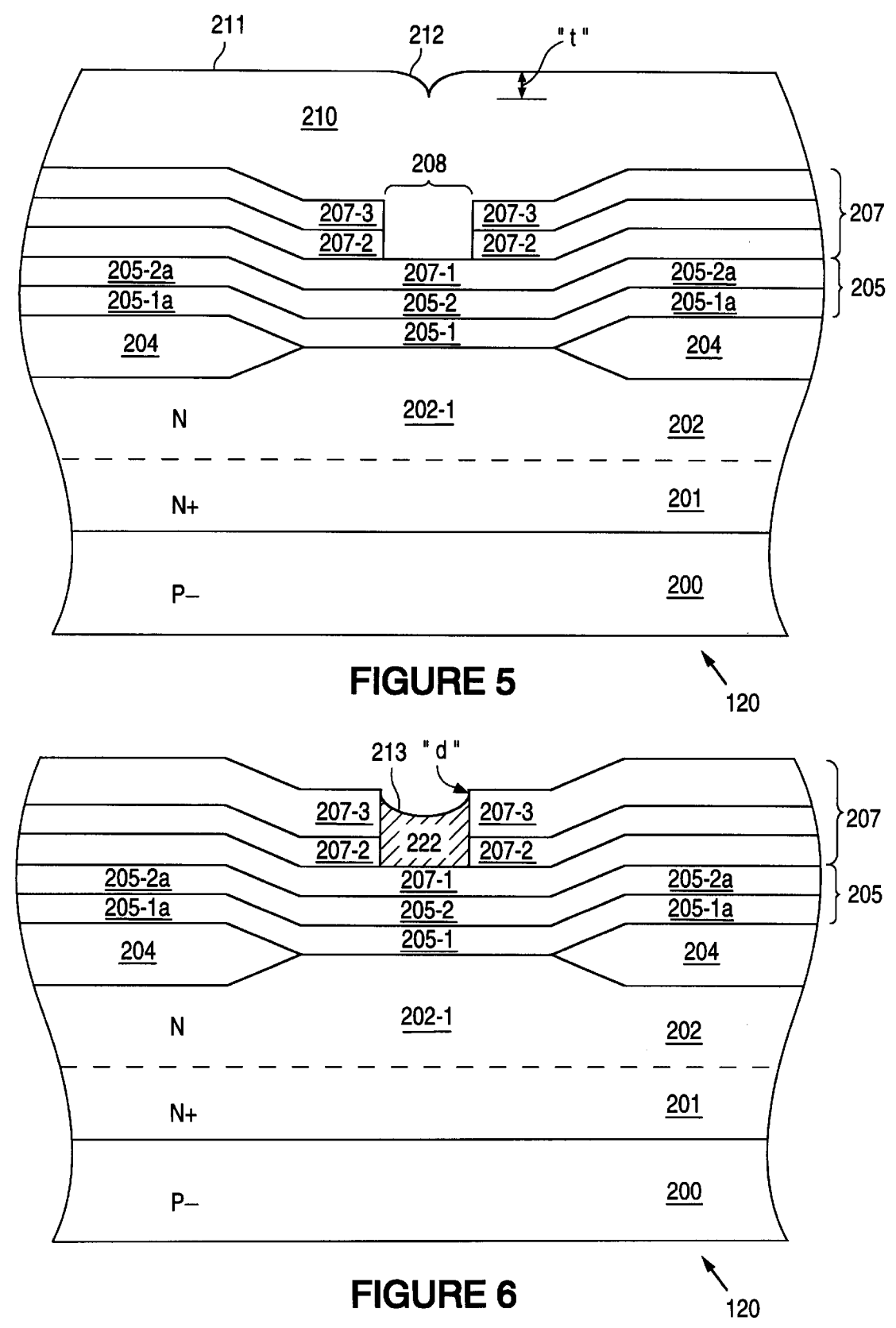
Figure 7:
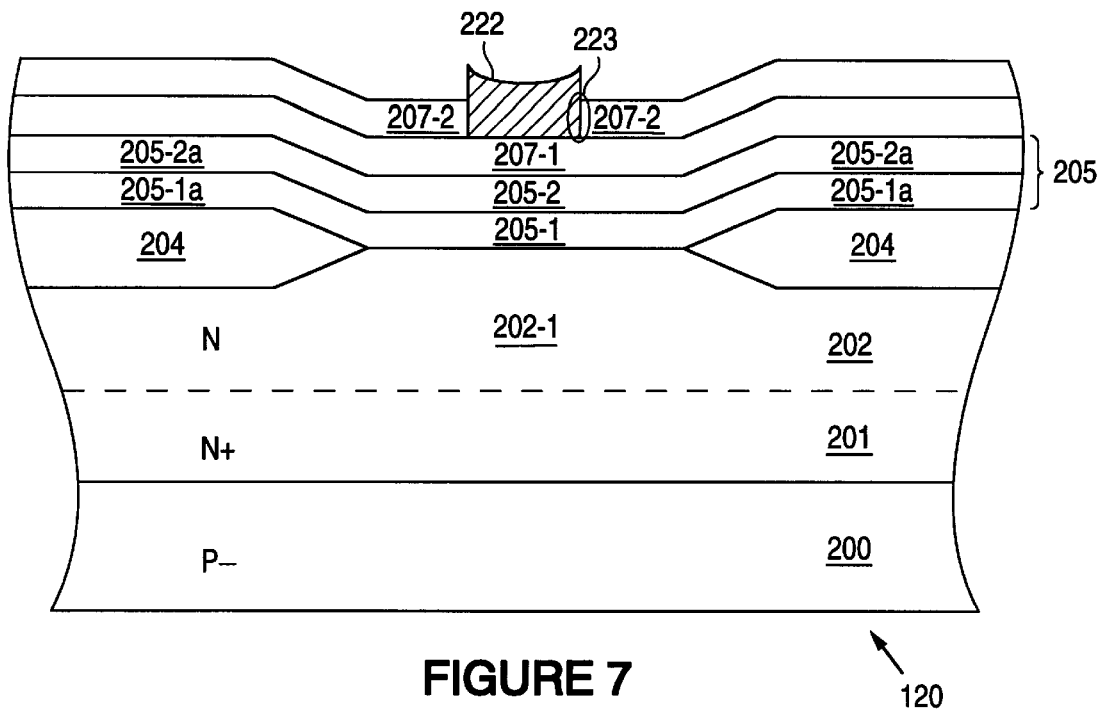

FIGS. 5–7 are cross sectional views disclosing the fabrication of a sacrificial emitter core 222 at successive stages in accordance with an embodiment of the invention. As shown in FIG. 5, an amorphous silicon layer 210 having a thickness ranging from about 3500 Å to about 7000 Å with a preferred thickness of approximately 5000 Å may be deposited over the second oxide layer 207-3 and the sacrificial emitter core window 208. In the preferred embodiment, the amorphous silicon layer 210 may be formed of amorphous silicon deposited by any methods known to those skilled in the art.

During the amorphous silicon layer 210 deposition, a cusp region 212 may form on an upper surface 211 of the amorphous silicon layer 210 directly above the sacrificial emitter core window 208. The cusp region 212 having a depth "t" measured from the upper surface 211 generally takes the form of the sacrificial emitter core window 208. It is highly desirable for reasons as will be described further hereinbelow that the cusp depth "t" must always be less than the thickness of the second oxide layer 207-3.

Thereafter the semiconductor wafer is appropriately patterned by conventional masking techniques well known to those skilled in the art. As shown in FIG. 6, selected portions of the amorphous silicon layer 210 are then removed using, for example a highly selective anisotropic reactive ion etch using for example HBr, $Cl_2$. The anisotropic reactive ion etch is highly selective in that it only removes the amorphous polysilicon included in the amorphous silicon layer 210 to the exclusion of the planarized silicon dioxide, such as TEOS, included in the second oxide layer 207-3. In this manner, the second oxide layer 207-3 remains substantially unaffected by the anisotropic etch thereby preserving the sacrificial emitter window 208 which serves to define a sacrificial emitter core 222 formed of the remaining portion of the amorphous silicon layer 210.

The anisotropic etch may also overetch the amorphous silicon layer 210 such that an upper portion 213 of the sacrificial emitter core 222 which includes the cusp region 212 may be located approximately an overetch distance "d" as measured from an upper surface of the second oxide layer 207-3. In a preferred embodiment, the overetch distance "d" may have a range from about 300 Å to approximately 700 Å with a preferred depth of approximately 500 Å. It should be noted that "t" should be such that it blocks the extrinsic base from reaching the intrinsic base. In this manner, the first oxide layer 207-1 may remain substantially unaffected by the anisotropic etch used to remove the amorphous silicon layer 210.

Thereafter, the sacrificial emitter core 222 is formed by selectively removing the second oxide layer 207-3. In a preferred embodiment a wet etch, such as for example a buffered oxide etch (BOE), may be used to selectively remove the second oxide layer 207-3 while leaving the polysilicon contained within the sacrificial emitter core window 208 substantially unaffected. By way of example, as shown in FIG. 7, the second oxide layer 207-3 may be removed exposing the substantially unaffected polysilicon included within the sacrificial emitter core window 208 to form the sacrificial emitter core 222. In another embodiment, an anisotropic dry etch may be used for selectively removing the second oxide layer 207-3.

A seal region 223 formed by the abutment of the separation layer 207-2 and the sacrificial emitter core 222 must be capable of substantially preventing any of etchant material, used in for example the buffered oxide etch described hereinabove, from "leaking" to the first oxide layer 207-1. By way of example, any amount of etchant reaching first oxide layer 207-1 by way of "leaky" seal region 223 may remove, or substantially chemically alter, sufficient amount of oxide from the first oxide layer 207-1 to expose, or otherwise impair the integrity of, the P-type intrinsic base layer 205-2, or even the collector region 202-1. Defects of this magnitude may be sufficient to cause the transistor device being formed to become non-functional.

Figure 8:
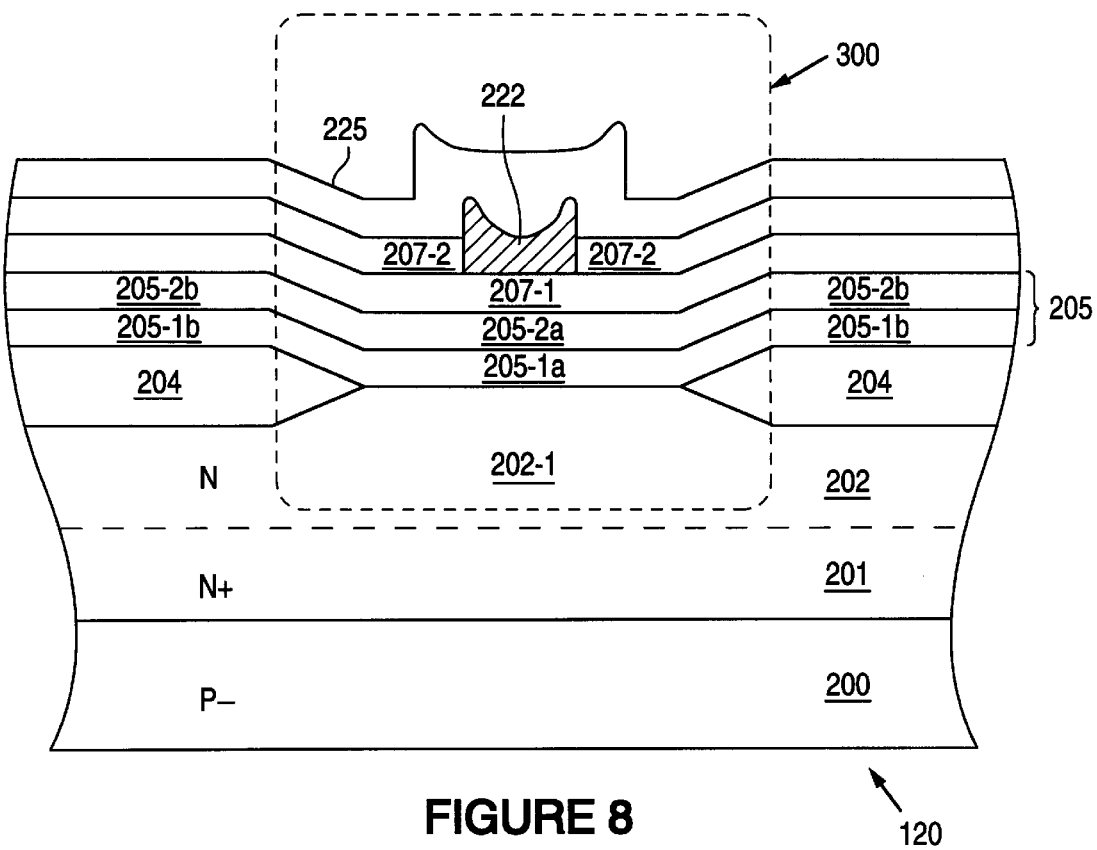
FIG. 8 illustrates a cross sectional view of the stacked semiconductor structure showing a layer of spacer material deposited on the sacrificial emitter core in accordance with an embodiment of the invention.

Thereafter, as shown in FIG. 8, a substantially conformal spacer layer 225 is deposited over the separation layer 207-2 and the sacrificial emitter core 222. Sectional view 300 highlights the portion of the stacked semiconductor structure 120 from which the self-aligned epitaxial base bipolar transistor is formed. In a preferred embodiment, the conformal spacer layer 225 may be formed of amorphous silicon deposited by, for example, a furnace deposition process having a furnace temperature range from about 500° C. to about 600° C. with a preferred furnace temperature of 550° C. In another embodiment, the conformal spacer layer 225 may be formed from silicon dioxide deposited in a LPCVD or TEOS process wherein the deposition temperature ranges from about 300° C. to about 500° C. with a preferred temperature of 400° C. In the preferred embodiment, the spacer layer 225 may have a thickness ranging from about 800 Å to about 1400 Å with a preferred thickness of approximately 1200 Å. As will be described hereinafter, it is of paramount importance that the thickness of the spacer layer 225 be well controlled and that the spacer layer 225 substantially conforms to the shape of the sacrificial emitter core 222.

Figure 9:
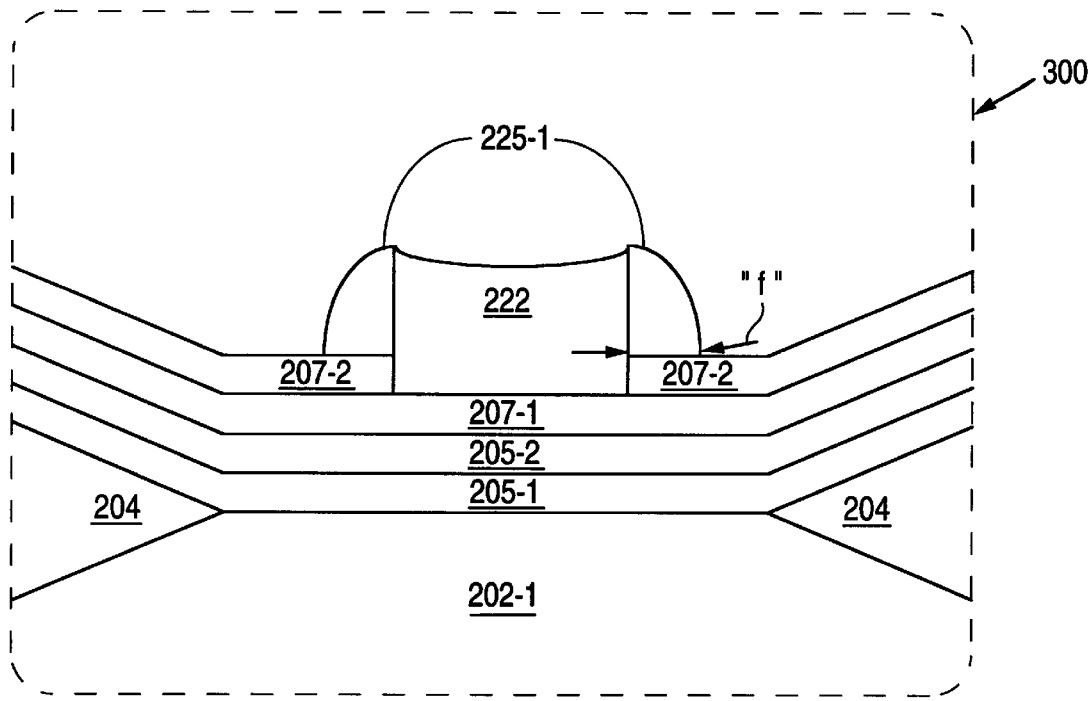
FIG. 9 illustrates a highlighted cross sectional view of the stacked semiconductor structure in FIG. 8 showing the formation of a spacer ring around the sacrificial emitter core.

FIGS. 9–16 are cross sectional views the portion 300 of the stacked semiconductor structure 120 disclosing the fabrication of the self-aligned epitaxial base bipolar transistor at successive stages in accordance with an embodiment of the invention. Referring first to FIG. 9, a spacer ring 225-1 formed from the spacer layer 225 surrounds the sacrificial emitter core 222. In a preferred embodiment, the spacer ring 225-1 may be formed by selectively removing the spacer layer 225 using conventional techniques well known in the art. One such technique may be, for example, an anisotropic reactive ion etch using $SF_6$, $CF_4$, HBr, $Cl_2$ as reactive gases. It should be noted for reasons as described hereinbelow, a thickness "f" of the spacer ring 225-1 must be well controlled. In a preferred embodiment, the thickness "f" of the spacer ring 225-1 has a range of about 1000 Å to about 1400 Å with a preferred thickness of about 1200 Å.

Figure 10:
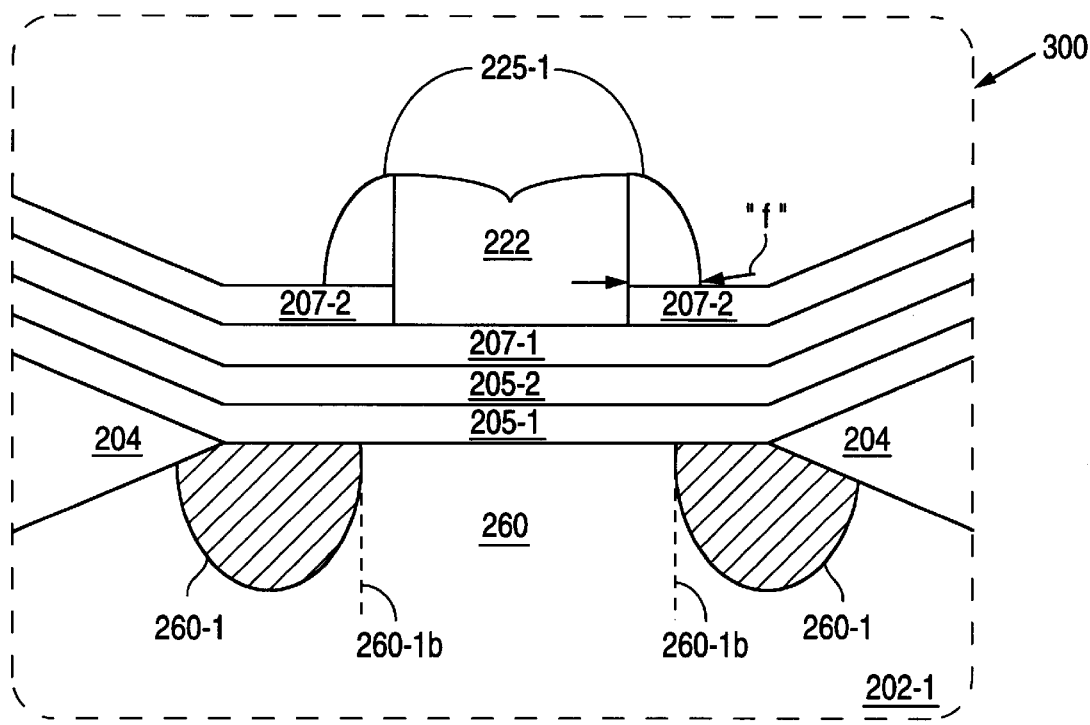
FIG. 10 illustrates a highlighted cross sectional view of the stacked semiconductor structure in FIG. 9 showing the formation of an extrinsic base region.

Turning now to FIG. 10 showing an extrinsic base region 260 formed by way of a conventional extrinsic base implant process well known to those skilled in the art. In the process of forming the extrinsic base region 260, a plurality of ions (in the form of a plasma) of a P-type impurity dopant, such as for example boron (B) or boron di-flouride (BF2), are accelerated by way of a voltage potential to a range of average kinetic energy from about 35 keV to about 50 keV with a preferred average kinetic energy of 40 keV.

The plurality of P-type impurity dopant ions are then directed at the regions to be implanted. In the described embodiment, the plurality of P-type dopant impurity ions substantially pass through the separation layer 207-2, the first oxide layer 207-1, and the intrinsic base region 205 coming to rest in the active collector 202-1 of the collector region 202. It should be noted that the plurality of isolation structures 204 and the presence of the combination of the sacrificial emitter core 222 and the spacer ring 225-1 substantially block the implantation of the P-type impurity dopant ions. In this way, an extrinsic base region 260 of implanted P-type epitaxial silicon is formed having an implanted base dopant profile 260-1 as shown. In a preferred embodiment, the concentration of the plurality of P-type impurity dopant ions implanted in the extrinsic base region 260 may range from about $1 \times 10^{15}/cm^2$ to about $4 \times 10^{15}/cm^2$ with a preferred concentration of $2 \times 10^{15}/cm^2$. It should be noted the implanted base dopant profile 260-1 has a first edge 260-1b defined by combination of the spacer ring 225-1 and the sacrificial emitter core 222. It should also be noted that the combination of the spacer ring 225-1 and the sacrificial emitter core 222 "cast a shadow" so as to prevent the P-type impurity dopant ions from reaching a portion 201-1a of the active collector 201-1. In this manner, the portion 201-1a may be preserved as an emitter region described herein below.

Figure 11:
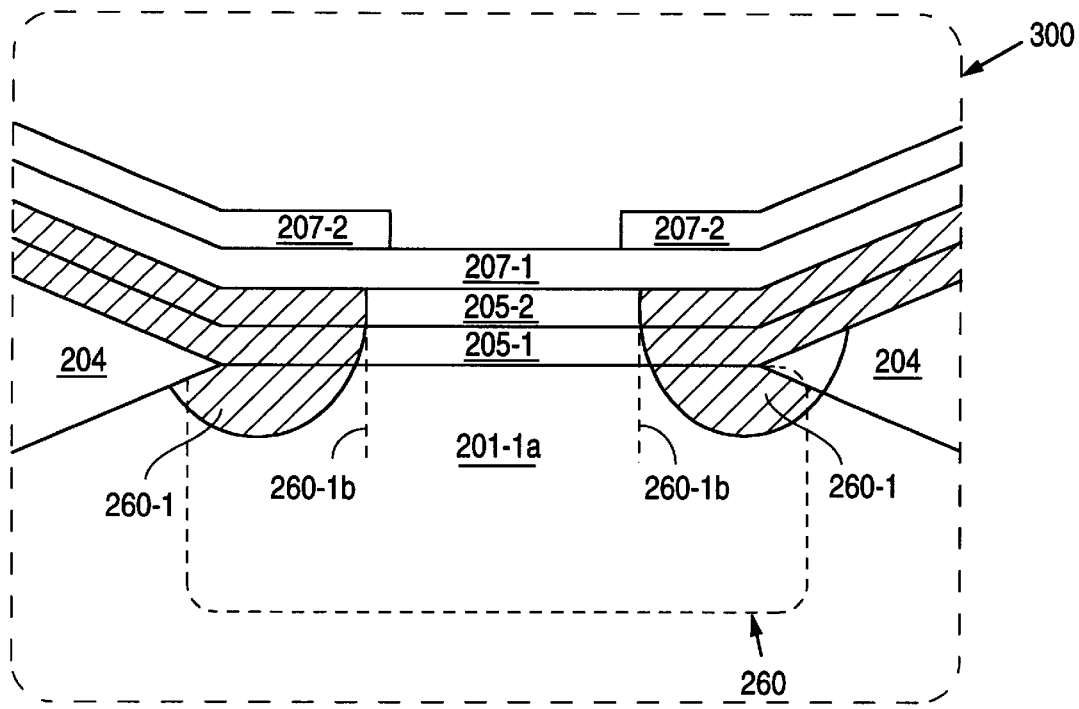
FIG. 11 illustrates a highlighted cross sectional view of the stacked semiconductor structure in FIG. 10 after removal of the sacrificial emitter core and the spacer ring.

Once the extrinsic base region 260 has been formed, the sacrificial emitter core 222 and the spacer ring 225-1 are removed as shown in FIG. 11 thereby exposing first oxide layer 207-1. In a preferred embodiment, the spacer ring 225-1 formed from silicon dioxide, may be removed by a wet etch, such as a buffered oxide etch (BOE) described hereinabove. Alternatively, if the spacer 225-1 is formed of amorphous silicon it may be removed by way of an anisotropic reactive ion etch, using for example $CF_4$, HBr, $Cl_2$ as reactive gases.

Figure 12:
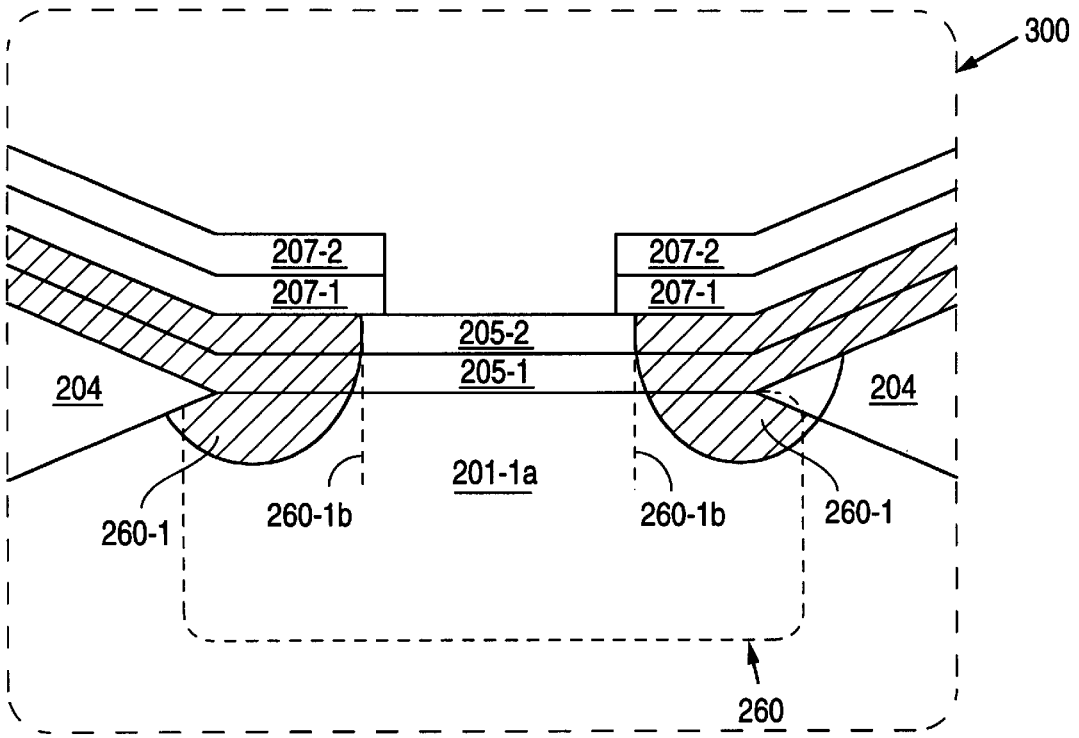
FIGS. 12–16 are cross sectional views disclosing the final successive steps in the fabrication of a self-aligned epitaxial base bipolar transistor in accordance with an embodiment of the invention.

Turning now to FIG. 12, the first oxide layer 207-1 is removed by way of an anisotropic reactive ion etch using for example, Ar, $C_4F_8$, CO and/or $O_2$ to expose P-type second intrinsic base layer 205-2. It should be noted, that after the removal of the first oxide layer 207-1, a wet dip, such as for example a buffered oxide etch (BOE), may be performed on the exposed second P-type intrinsic base layer 205-2 in order to remove any residual oxide that may have formed on the second P-type intrinsic base layer 205-2. The removal of any residual oxide is important to facilitate good electrical contact to the second P-type intrinsic base layer 205-2. As is well known in the art, any residual oxide which may form on the exposed second P-type intrinsic base layer 205b will have a thickness on the order of approximately 20 Å–50 Å.

Figure 13:
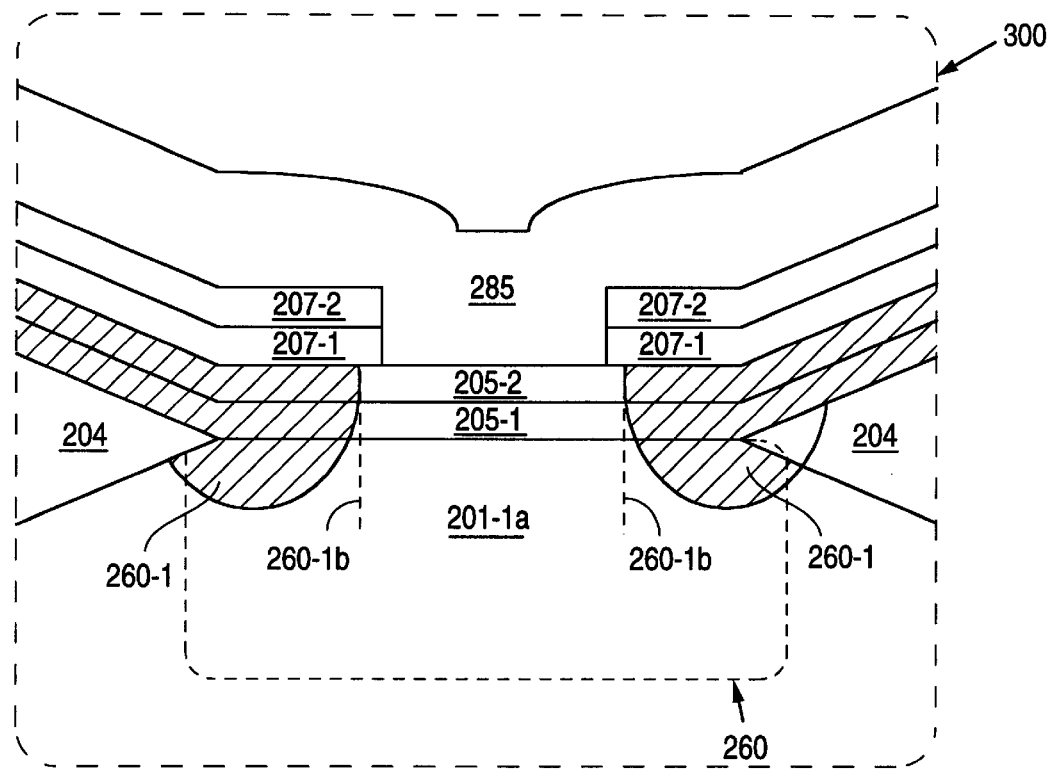

Turning now to FIG. 13, a polysilicon emitter layer 285 is blanket deposited over the exposed separation layer 207-2 by way of a furnace deposition process substantially similar to the process previously described for the deposition of the amorphous silicon layer 210. In a preferred embodiment, the polysilicon layer 285 may have a thickness ranging from about 1200 Å to about 2000 Å with a preferred thickness of 1500 Å.

Figure 14:
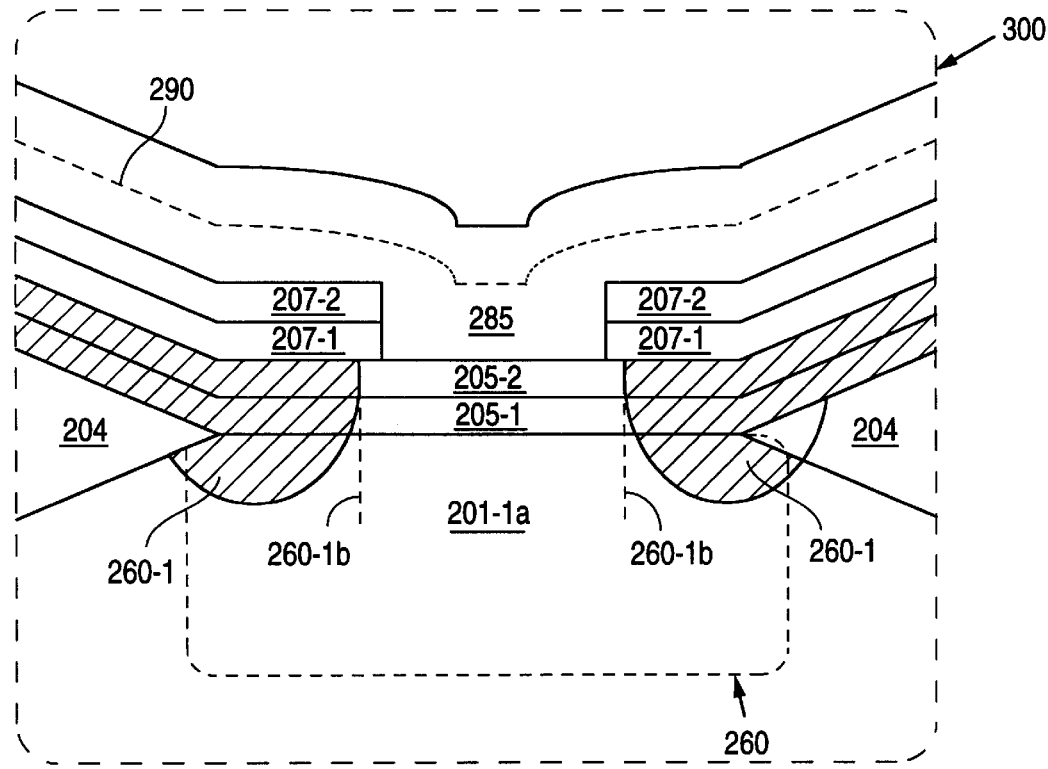

Thereafter, an emitter implant is performed resulting in a emitter dopant profile 290 included in the polysilicon emitter layer 285. The emitter dopant profile 290 may be formed by an ion implantation technique well known by those skilled in the art. In one such technique, a plurality of ions of an N-type impurity dopant, such as for example arsenic (As) and phosphorous (P) are accelerated to an average kinetic energy range of about 15 keV to about 25 keV with a preferred average kinetic energy of about 20 keV. The N-type impurity dopant ions are then directed to the polysilicon emitter layer 285 and the kinetic energy is adjusted so that it results in an emitter dopant profile 290 as illustrated in FIG. 14. In the preferred embodiment, the emitter dopant profile 290 may have a concentration of N-type impurity dopant ions ranging from about $1 \times 10^{20}/cm^3$ to about $4 \times 10^{20}/cm^3$ with a preferred concentration of $2 \times 10^{20}/cm^3$.

Figure 15:
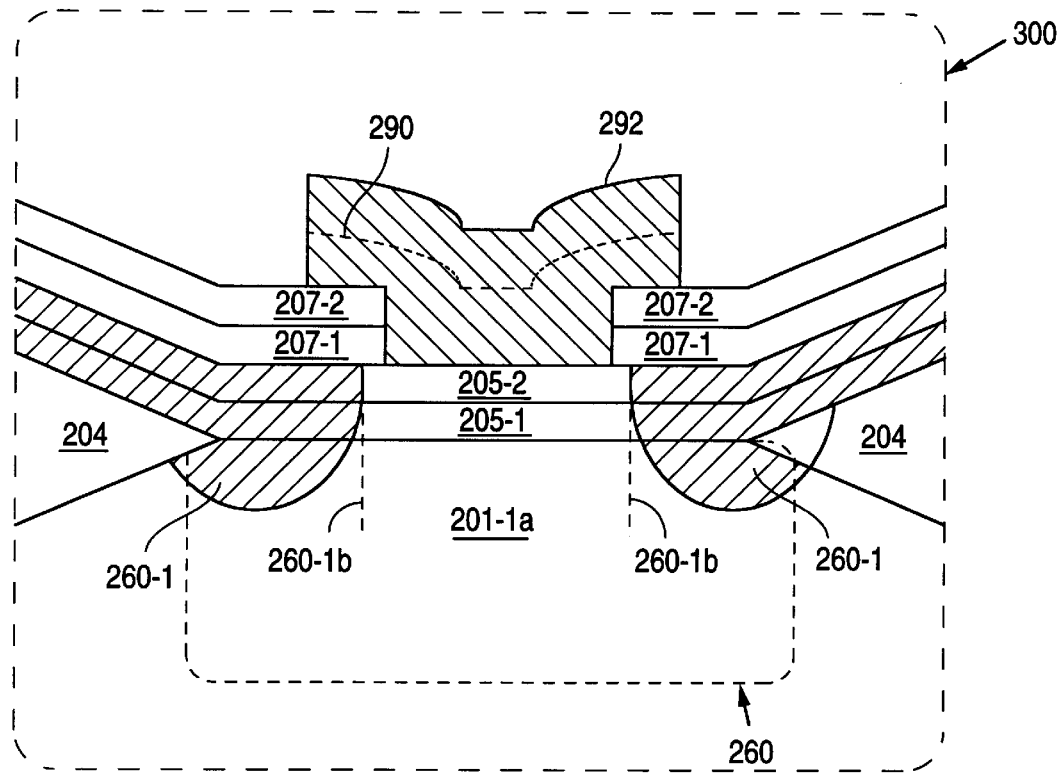

Thereafter, as shown in FIG. 15, an emitter structure 292 is defined by selectively masking the wafer to define selected portions of the emitter polysilicon layer 285. The emitter structure 292 is then formed by removing the selected portions of the emitter polysilicon layer 285. Removal of the selected portions of the emitter polysilicon structure 285 may be accomplished by any method known by those skilled in the art. One such method is an anisotropic etch using reactive gases such as $CF_4$, HBr, $Cl_2$ as described above.

Figure 16:
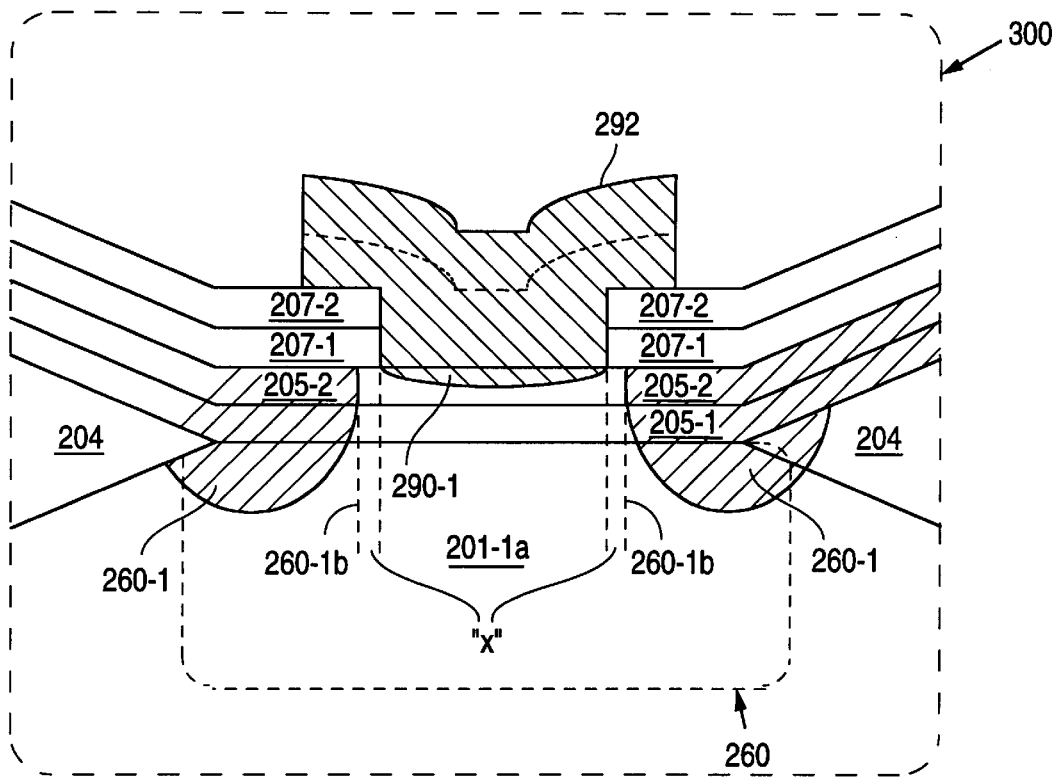

As shown in FIG. 16, a self-aligned bipolar transistor 295 is then formed by performing an emitter drive whereby the implanted N-type dopant impurity ions which form the emitter dopant profile 290 are thermally diffused into the second P-type layer 205-2 to form an emitter dopant profile 290-1. It should be noted that an emitter-extrinsic-base distance "x" is well controlled since it depends upon the width "f" of spacer ring 225-1 as described hereinabove. In a preferred embodiment, the emitter-extrinsic base distance "x" may have a range of about 800 Å to about 1200 Å with the preferred distance of 1000 Å.

The invention has numerous advantages. One advantage of the invention is that the extrinsic base to emitter distance of the epitaxial base bipolar transistor is self-aligned such that the extrinsic base to emitter junctions are well controlled needing no special photolithographic operations. Another advantage is the fact that this process can be implemented with a production friendly isolation process such as LOCOS without affecting the architecture. As a result, the self-aligned bipolar transistor according to the invention has substantially improved production yields, lower production costs, and improved production throughput.

Although the foregoing invention has been described in some detail for purposes of clarity of understanding, it will be apparent that certain changes and modifications may be practiced within the scope of the appended claims. It should be noted that there are may alternative ways of implementing the present invention. It is therefore intended that the following appended claims be interpreted as including all such alterations, permutations, and equivalents that fall within the spirit and scope of the present invention.

What is claimed is:

1. A method of forming a self-aligned epitaxial base bipolar transistor in a semiconductor material including a substrate structure having a collector region and a plurality of isolation structures, the method comprising:

forming an intrinsic base region over the collector region by,
depositing a first intrinsic base layer of an epitaxial semiconductor on the collector region, the first intrinsic base layer being doped with a first conductivity type, and
depositing a second intrinsic base layer of an epitaxial semiconductor on the first intrinsic base layer, the second intrinsic base layer being doped with a second conductivity type, the intrinsic base region being formed from an epitaxial semiconductor material;

forming a raised sacrificial emitter core on the intrinsic base region by
depositing a first oxide layer on the second intrinsic base layer,
depositing a separation layer on the first oxide layer;
depositing a second oxide layer on the separation layer;
anisotropically etching through the second oxide layer using a first etch;
anisotropically etching through the separation layer using a second etch to form a sacrificial emitter window that exposes the first oxide layer;
depositing a layer of sacrificial emitter material on the second oxide layer, and
removing a portion of the sacrificial emitter material layer and the second oxide layer;
depositing a substantially conformal spacer layer over the sacrificial emitter core;
anisotropically etching the spacer layer such that a protective spacer ring is formed about the sacrificial emitter core;
implanting a dopant into the epitaxial base region to form an extrinsic base region, wherein the sacrificial emitter core and spacer ring block a portion of the dopant to preserve a region where an emitter region is formed, wherein the spacer ring serves to self-align the extrinsic base region relative to the emitter region;

removing the sacrificial emitter core and protective spacer ring; and doping the emitter region to form the self-aligned epitaxial base bipolar transistor.

2. A method of forming a self-aligned epitaxial base bipolar transistor in a semiconductor material is recited in claim 1 wherein the epitaxial semiconductor material is silicon.

3. A method of forming a self-aligned epitaxial base bipolar transistor in a semiconductor material as recited in claim 1, wherein the first oxide layer is formed of silicon dioxide.

4. A method of forming a self-aligned epitaxial base bipolar transistor in a semiconductor material as recited in claim 1, wherein the separation layer is silicon nitride.

5. A method of forming a self-aligned epitaxial base bipolar transistor in a semiconductor material as recited in claim 1, wherein the separation layer is formed of silicon oxynitride.

6. A method of forming a self-aligned epitaxial base bipolar transistor in a semiconductor material as recited in claim 1, wherein the second oxide layer is formed of silicon dioxide.

7. A method of forming a self-aligned epitaxial base bipolar transistor in a semiconductor material as recited in claim 1, wherein the first etch is a reactive ion etch, the reactive ion etch using at least one of the group of $CF_4$, $HBr$, $Cl_2$.

8. A method of forming a self-aligned epitaxial base bipolar transistor in a semiconductor material as recited in claim 1, wherein the second etch is a reactive ion etch, the reactive ion etch using at least one of the group of $CF_4$, $HBr$, $Cl_2$.

9. A method of forming a self-aligned epitaxial base bipolar transistor in a semiconductor material as recited in claim 1, wherein the sacrificial emitter material is polysilicon.

10. A method of forming a self-aligned epitaxial base bipolar transistor in a semiconductor material having a substrate structure having a collector region of a first conductivity type formed therein, and a plurality of isolation structures, the method comprising:

depositing a first intrinsic base layer of an epitaxial semiconductor material on the collector region, the first intrinsic base layer being doped with the first conductivity type;

depositing a second intrinsic base layer of an epitaxial semiconductor on the first intrinsic base layer, the second intrinsic base layer being doped with a second conductivity type;

depositing a first oxide layer on the second intrinsic base layer, depositing a separation layer on the first oxide layer;

depositing a second oxide layer on the separation layer;

anisotropically etching through the second oxide layer using a first etch;

anisotropically etching through the separation layer using a second etch to form a sacrificial emitter window that exposes the first oxide layer;

depositing a layer of sacrificial emitter material on the second oxide layer;

forming a sacrificial emitter core by removing a portion of the sacrificial emitter material layer and the second oxide layer;

depositing a substantially conformal spacer layer over the sacrificial emitter core and the separation layer;

anisotropically etching through the second oxide layer using a first etch;

implanting a dopant into the epitaxial base region to form an extrinsic base region, wherein the sacrificial emitter core and spacer ring block a portion of the dopant to preserve a region where an emitter region is formed, wherein a spacer ring serves to self-align the extrinsic base region relative to the emitter region;

removing the sacrificial emitter core and protective spacer ring; and doping the region to form the emitter region to form the self-aligned epitaxial base bipolar transistor.

11. A method of forming a self-aligned epitaxial base bipolar transistor in a semiconductor material as recited in claim 10 wherein the epitaxial semiconductor material is silicon.

12. A method of forming a self-aligned epitaxial base bipolar transistor in a semiconductor material as recited in claim 10, wherein the first oxide layer is formed of silicon dioxide.

13. A method of forming a self-aligned epitaxial base bipolar transistor in a semiconductor material as recited in claim 10, wherein the separation layer is silicon nitride.

14. A method of forming a self-aligned epitaxial base bipolar transistor in a semiconductor material as recited in claim 10, wherein the separation layer is formed of silicon oxynitride.

15. A method of forming a self-aligned epitaxial base bipolar transistor in a semiconductor material as recited in claim 10, wherein the second oxide layer is formed of silicon dioxide.

16. A method of forming a self-aligned epitaxial base bipolar transistor in a semiconductor material as recited in claim 10, wherein the first etch is a reactive ion etch, the reactive ion etch using at least one of the group of $CF_4$, $HBr$, $Cl_2$.

17. A method of forming a self-aligned epitaxial base bipolar transistor in a semiconductor material as recited in claim 10, wherein the second etch is a reactive ion etch, the reactive ion etch using at least one of the group of $CF_4$, $HBr$, $Cl_2$.

18. A method of forming a self-aligned epitaxial base bipolar transistor in a semiconductor material as recited in claim 10, wherein the sacrificial emitter material is polysilicon or amorphous silicon.

* * * * *